United States Patent
Popp et al.

(10) Patent No.: US 10,756,294 B2
(45) Date of Patent: Aug. 25, 2020

(54) PROCESS FOR PRODUCING AN INSULATOR LAYER, PROCESS FOR PRODUCING AN ORGANIC OPTOELECTRONIC COMPONENT COMPRISING AN INSULATOR LAYER AND ORGANIC OPTOELECTRONIC COMPONENT COMPRISING AN INSULATOR LAYER

(71) Applicant: OSRAM OLED GmbH, Regensburg (DE)

(72) Inventors: Michael Popp, Freising (DE); Andrew Ingle, Allershausen (DE); Christoph Kefes, Regensburg (DE); Johannes Rosenberger, Regensburg (DE); Stefan Dechand, Regensburg (DE); Egbert Hoefling, Regensburg (DE); Benjamin Claus Krummacher, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 467 days.

(21) Appl. No.: 15/311,182

(22) PCT Filed: Apr. 15, 2015

(86) PCT No.: PCT/EP2015/058183
§ 371 (c)(1),
(2) Date: Nov. 14, 2016

(87) PCT Pub. No.: WO2015/172961
PCT Pub. Date: Nov. 19, 2015

(65) Prior Publication Data
US 2017/0084864 A1 Mar. 23, 2017

(30) Foreign Application Priority Data
May 15, 2014 (DE) .................. 10 2014 106 885

(51) Int. Cl.
*H01B 3/40* (2006.01)
*C08G 59/50* (2006.01)
(Continued)

(52) U.S. Cl.
CPC .......... *H01L 51/5237* (2013.01); *C08G 59/50* (2013.01); *C08G 59/5006* (2013.01);
(Continued)

(58) Field of Classification Search
CPC .................. C09J 163/00; C08L 63/00
See application file for complete search history.

(56) References Cited

U.S. PATENT DOCUMENTS 2,553,718 A * 5/1951 Newey ............... C08G 59/5033
523/427
2,668,805 A * 2/1954 Greenlee ............. C08G 59/621
525/524
(Continued)

FOREIGN PATENT DOCUMENTS

DE           60320004 T2    4/2009
DE       102012222772 A1    3/2014
(Continued)

OTHER PUBLICATIONS

Machine Translation of JP11-140416A. May 25, 1999. (Year: 1999).*
(Continued)

*Primary Examiner* — Stephen E Rieth
(74) *Attorney, Agent, or Firm* — McDermott, Will & Emery LLP

(57) ABSTRACT

A method is specified for production of an insulator layer. This method comprises the following process steps: A) providing a precursor comprising a mixture of a first, a second and a third component where—the first component comprises a compound of the general

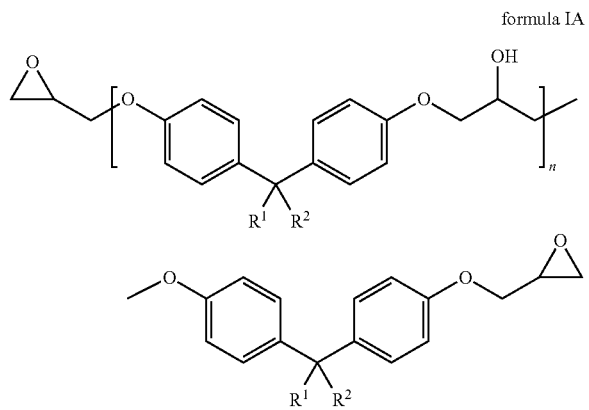

formula IA where R1 and R2 are each independently selected from a group comprising hydrogen and alkyl radicals and n=1 to 10 000; the second component comprises a compound of the general

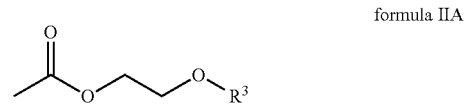

formula IIA where R3 is an alkyl radical, and the third component comprises at least one amine compound; B) applying the
(Continued)

precursor to a substrate; C) curing the precursor to form the insulator layer. The first compound comprises an epoxy group and a hydroxyl group. The second compound comprises an ester group. The curing takes place at room temperature or at temperatures between 50° C. and 260° C.

9 Claims, 3 Drawing Sheets (51) Int. Cl.
*H01L 51/52* (2006.01)
*H01L 51/00* (2006.01)
*H01L 51/56* (2006.01)
*C08K 5/101* (2006.01)
*H01L 27/32* (2006.01)

(52) U.S. Cl.
CPC .......... *C08G 59/5033* (2013.01); *C08K 5/101* (2013.01); *H01B 3/40* (2013.01); *H01L 27/3246* (2013.01); *H01L 27/3283* (2013.01); *H01L 51/0035* (2013.01); *H01L 51/5212* (2013.01); *H01L 51/56* (2013.01); *H01L 51/5203* (2013.01); *H01L 2251/5392* (2013.01)

(56) References Cited

U.S. PATENT DOCUMENTS

| | | | | |
|---|---|---|---|---|
| 4,689,390 | A | * 8/1987 | Suzuki | C08G 59/10 528/104 |
| 5,620,831 | A | * 4/1997 | Kawana | C07C 279/28 430/280.1 |
| 6,569,491 | B1 | 5/2003 | Courduvelis | |
| 2004/0258958 | A1 | 12/2004 | Cheng et al. | |
| 2012/0091923 | A1 | 4/2012 | Kastner-Jung et al. | |
| 2012/0318571 | A1 | 12/2012 | Tietze et al. | |
| 2014/0076198 | A1 | 3/2014 | Kim et al. | |

FOREIGN PATENT DOCUMENTS

| | | | | |
|---|---|---|---|---|
| JP | 11140416 | A | * 5/1999 | |
| WO | 9212192 | A2 | 7/1992 | |
| WO | 0022025 | A1 | 4/2000 | |
| WO | WO-2012108320 | A1 | * 8/2012 | .......... H01L 23/295 |

OTHER PUBLICATIONS

IARC Monographs on the Evaluation of Carcinogenic Risks to Humans. World Health Organization International Agency for Research on Cancer. 1989, vol. 47, pp. 237-261. (Year: 1989).*

Machine Translation of WO2012/108320 A1. Aug. 16, 2012. (Year: 2012).*

Dipropylene glycol monomethyl ether. OPES Limited. http://opeslimited.com/chemicals/dipropylene-glycol-monomethyl-ether/. As viewed on Apr. 3, 2019. (Year: 2019).*

Cellosolve acetate material safety data sheet. Comet Chemical Company Ltd. Aug. 7, 2008. (Year: 2008).*

Pham, H.Q., et al, "Epoxy Resins", Ullmann's Encyclopedia of Industrial Chemistry, vol. 13, 2012, pp. 156-244.

"Butyl Cellosoive Acetate Solvent", Product Information, The Dow Chemical Company, Mar. 2004, 2 pgs.

Roempp, "Butylglycolacetat", Georg Thieme Verlag KG, On-line version, retrieved from <https://roempp.thieme.de/roempp4.0/do/data/RD-02-03184>, Mar. 2013, 3 pgs.

"Epoxidharz", Wikipedia, retrieved from <http://de.wikipedia.org/wiki/Epoxidharz>, 2014, 9 pgs.

Hanabata, M. et al., Novolac-based Resists, Advanced Materials for Optics and Electronics, vol. 4, 1994, pp. 75-82.

"Material Safety Data Sheet", Nazdar Ink Technologies, Jun. 19, 2012, pp. 1-5.

"Positie-Tone Photosensitive Polyimide for Insulation Layer in OLED/PLED", Toray Industries Inc., Ver. 10-2, Jun. 11, 2007, 22 pgs.

* cited by examiner

PROCESS FOR PRODUCING AN INSULATOR LAYER, PROCESS FOR PRODUCING AN ORGANIC OPTOELECTRONIC COMPONENT COMPRISING AN INSULATOR LAYER AND ORGANIC OPTOELECTRONIC COMPONENT COMPRISING AN INSULATOR LAYER

CROSS-REFERENCE OF RELATED APPLICATIONS

This patent application is the U.S. National Phase under 35 U.S.C. § 371 of International Patent Application No. PCT/EP2015/058183, filed Apr. 15, 2015, which in turn claims the priority of German patent application 10 2014 106 885.8, filed on May 15, 2014, the disclosure of which is incorporated herein by reference.

The invention relates to a method for producing an insulator layer, a method for producing an organic optoelectronic component comprising an insulator layer and an organic optoelectronic component comprising an insulator layer.

The service life of organic optoelectronic components such as organic light-emitting diodes (OLEDs) is often times very short. The reduction of service life in surface light sources such as OLEDs is caused by degradation of organic materials, spontaneous failures by particles or by chemical reaction of process-technology-based pretreated/untreated materials with, e.g., the organic materials of the light-emitting layer, resulting in a darkening of peripheral regions of the light-emitting layer. The darkening of peripheral regions of the light-emitting layer, which may also be referred to as narrowing of the light-emitting area or pixel shrinkage, is triggered by a temperature, ozone, UV radiation and/or a plasma acting on insulator layers, which are adjacent to the light-emitting layer, based upon a process partially destroying said layer, said layer reacting with the organic material of the light-emitting layer then. However, said processes are exactly required to improve the service life of an OLED, for example by improving the injection of charge carriers of a transparent electrode into the functional layers by using UV-radiation, ozone and/or plasma. Another problem is that, due to increased temperatures, components of the insulator layers outgas, damaging the light-emitting area thereby.

It is known from the prior art to avoid the problem of narrowing of the light-emitting area by dispensing with temperature, ozone, UV and plasma treatments. However, dispensing with such processes, such as application of a thin film encapsulation by means of ALD, MLD, CVD or PECVD, also results in a reduction of the service life of an organic optoelectronic component, so that narrowing of the light-emitting area will not take place or hardly take place, but the organic optoelectronic component nevertheless has a very short service life. Organic optoelectronic components without insulator layers are also known. However, they come with the disadvantage that there is no design freedom left in terms of placing the contacts, for example. Resist-free substrates are also known, which will have an adverse effect on the support stability, however.

Thus, the object of at least one embodiment of the present invention is to provide a method for producing an insulator layer which has an improved chemical durability compared to the prior art. Another object is to provide a method for producing an organic optoelectronic component comprising an insulator layer and an organic optoelectronic component comprising an insulator layer having an increased service life.

Advantageous embodiments and developments of the present invention are indicated in the respective dependent claims.

A method for producing an insulator layer is provided. The method comprises the methods steps of:

A) providing a precursor by mixing a first, a second and a third component;
B) applying the precursor to a substrate;
C) curing the precursor for the formation of the insulator layer.

The first component comprises a compound of the general formula IA formula IA wherein
$R^1$ and $R^2$ are each independently selected from a group that comprises hydrogen and alkyl radicals and n=1 to 10,000.

The second component comprises a compound of the general formula IIa formula IIA wherein $R^3$ is an alkyl radical.

The third component comprises at least one amine compound.

The method allows providing insulator layers that are chemically stable toward the influence of temperature, UV-radiation, ozone and/or plasma. That means that the insulator layers will not degrade under said influences nor lose nor lessen their properties in terms of electric insulation.

The method may be part of a method for producing an electric, in particular organic optoelectronic component. Here, it is possible that the precursor is applied in method step B) directly to an electrode and/or a bus bar.

In one embodiment, $R^1$ and $R^2$ are each independently selected from a group that comprises hydrogen, methyl radicals, ethyl radicals, n-propyl radicals, i-propyl radicals, n-butyl radicals. Preferably, $R^1$ and $R^2$ are independently selected from a group that comprises hydrogen, methyl radicals and ethyl radicals.

In one embodiment, the compound of formula IA has the following formula IA-1.

formula IA-1

In one embodiment, the first component contains 45 to 65 weight percent, preferably 50 to 60 weight percent of the compound of formula IA, in particular of the compound of formula IA-1 with respect to the total weight of the first component.

In one embodiment, the first component comprises at least one compound of the general formula IB. According to this embodiment, the first component comprises a compound of the general formula IA and at least one compound of the general formula IB wherein $R^5$, $R^6$, $R^7$ and $R^9$ are each independently selected from a group that contains hydrogen, methyl radicals, ethyl radicals,

$R^8$ is selected from a group that contains hydrogen, methyl radicals, ethyl radicals, n-propyl radicals, i-propyl radicals and n-butyl radicals, and wherein ⸺ represents the links of the $R^4$ moiety to the compounds of the general formula IB.

The compounds of formula IB serve to delay curing of the precursor and for dilution.

For example, the at least one compound of formula IB comprises one of the following formulas IB-1, IB-2, IB-3 or IB-4:

-continued

In one embodiment, the first component contains 16 to 50 weight percent, preferably 21 to 45 weight percent of the at least one compound of formula IB with respect to the total weight of the first component.

For example, the compounds of formulas IB-1, IB-2, IB-3 or IB-4 may react with one or both epoxy radicals of formula IA. For example, said reaction is effected with a cationic $BF_3$ catalyst, which is part of the precursor then. For example, the following reaction takes place:

In the reaction equation, $R^xOH$ represents a compound of formula IB and represents a compound of formula IA.

In one embodiment, the compounds of formula IB do not exhibit a reaction.

In one embodiment, the first component comprises a compound of the general formula IA, in particular compound IA-1, and two, three or four different compounds of the general formula IB or the first component consists of a compound of the general formula IA, in particular the compound of formula IA-1 and two, three or four different compounds of the general formula IB. For example, two different compounds of the general formula IB are compounds with formulas IB-1 and IB-2, respectively.

In one embodiment, the first component comprises a compound of the general formula IA, in particular a compound of formula IA-1, a compound of formula IB-1, a compound of formula IB-2, a compound of formula IB-3 and a compound of formula IB-4, or the first component consists of said compounds.

In one embodiment, the first component contains or consists of 50 to 60 weight percent of the compound of formula IA-1, 10 to 20 weight percent of the compound of formula IB-1, 5 to 10 weight percent of the compound of formula IB-2, 1 to 5 weight percent of the compound of formula IB-3 and 5 to 10 weight percent of the compound of formula IB-4, each with respect to the total weight of the first component.

In one embodiment, $R^3$ of the compound of the general formula IIA is selected from a group comprising methyl radicals, ethyl radicals, n-propyl radicals, i-propyl radicals, n-butyl radicals.

According to one embodiment, the compound of the general formula IIA of the second component has the following formula IIA-1:

IIA-1

In one embodiment, the second component has 60 to 100 weight percent of the compound of formula IIA-1 with respect to the total weight of the second component.

The second component serves for delaying the curing of the precursor. This may prevent that the precursor cures or that the three components completely react with one another already when mixing the first, the second and the third component and in method step B) when applying the precursor to a substrate. The addition of the second component can ensure a rapid and efficient application of the precursor to a substrate. For example, the second component also enables applying the precursor by means of a screen printing method without the screen mashes gumming up or clogging due to an early curing.

In one embodiment, the compounds of formula IIA-1 do not exhibit a reaction.

The compound of formula IIA-1 may enter a reaction at the carbonyl carbon with one of the other components. It is possible to add a catalyst in order to achieve a reaction at the carbonyl carbon.

In one embodiment, the precursor is applied in method step B) by means of screen printing, squeegeeing or an inkjet method.

In one embodiment, a chemical reaction takes place between the compounds of the first and the third component or between the compounds of the first, the second and the third component in method step C).

The at least one amine compound is used as a curing agent. That means that the at least one amine compound at least in method step C) reacts with the compound of formula IA. In particular, this results in a linkage of multiple molecules of the compound of formula IA, so that a three-dimensional network develops.

In one embodiment, the amine compound is selected from a group that comprises the compound of formula III-1, the compound of formula III-2 and combinations thereof.

III-1

III-2

In one embodiment, the following reaction takes place:

In the reaction equation, $H_2NR_z$ represents an amine compound, for example the compound of formula III-1 and represents a compound of formula IA. All of the other H-atoms bound to N may also be substituted in such a way that a three-dimensional network develops.

In one embodiment, the third component contains 5 to 20 weight percent, preferably 6 to 15 weight percent of the at least one amine compound with respect to the total weight of the third component. In this embodiment, a very strongly cross-linked three-dimensional network develops.

In one embodiment, the third component comprises at least one amine compound and at least one of the compounds of formulas IB-2 and III-3 and xylene. The compounds of formulas IB-2 and III-3 and xylene are used for dilution and for delaying the curing of the precursor. In particular, these compounds do not exhibit a reaction.

IB-2

III-3

The xylene may be para-, meta-, and/or orthoxylene.

In one embodiment, the third component contains the compound of formula III-1 and the compound of formula III-2.

In one embodiment, the third component comprises a compound of formula III-1, a compound of formula III-2, a compound of formula III-3, a compound of formula IB-2 and xylene, or the third component consists of said compounds.

In one embodiment, the third component contains or consists of 5 to 10 weight percent of the compound of formula III-1, 1 to 5 weight percent of the compound of formula III-2, 10 to 20 weight percent of the compound of formula IB-2, 10 to 20 weight percent of the compound of formula III-3 and 10 to 20 weight percent xylene, each with respect to the total weight of the third component.

According to one embodiment, the precursor consists of a mixture of the first, the second and the third component and the first component is present at a concentration of 70 to 80 weight percent, preferably 73 to 78 weight percent with respect to the total weight of the precursor.

According to one embodiment, the precursor consists of a mixture of the first, the second and the third component and the second component is present at a concentration of 5 to 15 weight percent, preferably 8 to 13 weight percent with respect to the total weight of the precursor.

According to one embodiment, the precursor consists of a mixture of the first, the second and the third component and the third component is present at a concentration of 10 to 20 weight percent, preferably 13 to 18 weight percent, with respect to the total weight of the precursor.

According to one embodiment, the precursor consists of a mixture of the first, the second and the third component and the first component is present at a concentration of 70 to 80 weight percent, the second component is present at a concentration of 5 to 15 weight percent, and the third component is present at a concentration of 10 to 20 weight percent with respect to the total weight of the precursor.

In one embodiment, the first component comprises a compound of the general formula IA, in particular the compound of formula IA-1, a compound of formula IB-1, a compound of formula IB-2, a compound of formula IB-3 and a compound of formula IB-4, or the first component consists of said compounds. The second compound consists of or comprises the compound of formula IIA-1 and the third component comprises or consists of a compound of formula III-1, a compound of formula III-2, a compound of formula III-3, a compound of formula IB-2 and xylene.

In one embodiment, method step C) is conducted at room temperature. Room temperature means approximately 20° C. It is also possible that the curing is effected at temperatures between 50° C. and 260° C., preferably between 140° C. and 240° C., particularly preferably between 180° C. and 220° C.

In one embodiment, compounds of the first, second and/or third component are vaporized in method step C). In particular, compounds that were not subject to a chemical reaction and/or that are not part of the three-dimensional network are vaporized. Particularly preferably, compounds are vaporized that are present for dilution and/or delaying the curing.

In one embodiment, the precursor is cured in method step C) for 0.01 to 3 h, preferably for 0.1 to 2 h, particularly preferably for 0.5 to 1.5 h.

In one embodiment, at least in method step C) the following reaction of the compound of the general formula IA with the compound of formula III-1 takes place:

Said reaction is an addition reaction. In an analogous way, the remaining NH$_2$ groups in the addition product may add further molecules of the compound of formula IA and the remaining epoxy group may add a further molecule of formula III-1. By this addition reaction a three-dimensional network develops.

In one embodiment, no amounts or only very low amounts of NH and NH$_2$ groups are left in the insulator layer.

Furthermore, use of an insulator layer in an organic optoelectronic component is provided. Here, the insulator layer is produced from a precursor that comprises a mixture of a first, a second and a third component, wherein
the first component comprises a compound of the general formula IA formula IA wherein
R$^1$ and R$^2$ are each independently selected from a group comprising hydrogen and alkyl radicals and n=1 to 10,000;
the second component comprises a compound of the general formula IIA formula IIA wherein R$^3$ is an alkyl radical, and
the third component comprises one amine compound.

The insulator layer for use in an organic optoelectronic component can be produced by a method according to the above described embodiments. Thus, all features of the method for producing an insulator layer also apply to the use of an insulator layer in an organic optoelectronic component.

According to one embodiment, use of the insulator layer for electric insulation of, for example, a first and a second electrode in an organic optoelectronic component is indicated.

Furthermore, a method for producing an organic optoelectronic component is provided. Said method comprises the method steps of:
a) providing a substrate,
b) applying a first electrode to the substrate, c) applying a light-emitting layer to the first electrode,
d) producing at least a first insulator layer with the method steps A, B and C:
A) providing a precursor that comprises a mixture of a first, a second and a third component;
B) applying the precursor to the substrate;
C) Curing the precursor for the formation of the insulator layer;
e) Applying a second electrode (3) to the light-emitting layer (4).

The first component comprises a compound of the general formula 1A formula IA wherein R$^1$ and R$^2$ are each independently selected from a group that comprises hydrogen and alkyl radicals and N=1 to 10,000.

The second component comprises a compound of the general formula IIA formula IIA wherein R$^3$ is an alkyl radical.

The third component comprises at least one amine compound.

The at least one insulator layer can be produced by means of a method for producing an insulator layer according to the above described embodiments. All features of the method for producing an insulator layer thus also apply to the method for producing an organic optoelectronic component.

The fact that a layer or an element is applied or arranged "to" or "above" another layer or another element may mean, here and in the following, that the one layer or the one element is arranged on the other layer or the other element in a direct mechanic and/or electric contact. Further, it may also mean that the one layer or the one element is indirectly arranged on or above the other layer or the other element. Here, further layer and/or elements may be arranged between one or the other layer or between one and the other element, respectively.

One embodiment includes a method step f): "applying a thin film encapsulation to the second electrode by means of ALD, MLD, CVD and/or PECVD." As used herein, an encapsulation designed as a thin film encapsulation relates to an encapsulation that is capable of forming a barrier toward atmospheric substances, in particular toward moisture and hydrogen and/or toward further harmful substances such as corrosive gases, for example hydrogen sulfide. In other words, the thin film encapsulation is designed such, that it can be penetrated by atmospheric substances by at most very low fractions. Said barrier effect is achieved in the thin film encapsulation essentially by barrier layers and/or passivation layers designed as thin layers, which are part of the encapsulation. The layers of the encapsulation usually have a thickness of equal to or less than several 100 nm.

In particular, the thin film encapsulation may comprise or consist of thin layers, which are responsible for the barrier effect of the encapsulation. The thin layers may, for example, be applied by atomic layer deposition (ALD) or molecular layer deposition (MLD). Suitable materials for the layers of the encapsulation arrangement are, for example, aluminum oxide, tin oxide, zirconium oxide, titanium oxide, hafnium oxide, lanthanum oxide, tantalum oxide. Preferably, the encapsulation comprises a layer sequence with a plurality of the thin layers, each having a thickness between one atomic layer and several 100 nm.

Alternatively or additionally to thin layers produced by means of ALD or MLD, the encapsulation may comprise at least one or a plurality of further layers, i.e. in particular barrier layers and/or passivation layers deposited by means of thermal evaporation deposition or by means of a plasma-enhanced process such as sputtering, chemical vapor deposition (CVD) or plasma-enhanced chemical vapor deposition (PECVD). Suitable materials to that end may include the above-mentioned materials as well as silicon nitride, silicon oxide, silicon oxynitride, indium tin oxide, indium zinc oxide, aluminum-doped zinc oxide, aluminum oxide as well as mixtures and alloys of the stated materials. The one or multiple layers may, for example, each have a thickness between 1 nm and 5 µm and preferably between 1 nm and 400 nm, with the limits being included in said range.

In one embodiment, in method step d), a first and a second insulator layer is produced.

The first, or the first and the second insulator layer can be directly applied to the first electrode in method step B).

In one embodiment, the first, or the first and the second insulator layer are applied between the first and the second electrode in such a way that the latter are electrically insulated from one another during operation of the device by means of the first or the first and the second insulator layer.

In one embodiment, after method step b), the following method steps take place: b1) applying bus bars to the first electrode; b2) applying further insulator layers to the bus bars. The further insulator layers are produced like the first insulator layer.

In one embodiment of the method, after applying the first, the first and the second or the first, the second and the further insulator layers, a method step g) takes place: "Plasma, ozone or UV treatment of the substrate, the first electrode, the second electrode or the thin film encapsulation".

Using the plasma, ozone or UV-treatment of the substrate, the first electrode, the second electrode or the thin film encapsulation, the service life and efficiency of the optoelectronic component can be improved. Said methods are suitable since the insulator layers according to the invention are chemically stable toward said influences. Due to the fact that the insulator layers will not degrade, a narrowing of the light-emitting area will not take place or only hardly take place.

Furthermore, an organic optoelectronic component is provided. Said component comprises
a substrate,
a first electrode on the substrate,
a light-emitting layer on the first electrode,
a second electrode on the light-emitting layer,
at least one first insulator layer between the first and the second electrode, wherein the at least one first insulator layer is produced from a precursor that comprises a mixture of a first, a second and a third component, wherein
the first component comprises a compound of the general formula IA:

formula IA wherein
R$^1$ and R$^2$ are each independently selected from a group that comprises hydrogen and alkyl radicals and n=1 to 10,000;
the second component comprises a compound of the general formula IIA formula IIA wherein R$^3$ is an alkyl radical, and
the third component comprises an amine compound.

The first, as well as the second and further insulator layers (described below) of the organic optoelectronic component may be produced according to the above specifications regarding the method for producing an insulator layer. The optoelectronic component can be produced according to the embodiments of the method for producing an organic optoelectronic component.

The fact that a layer or an element is arranged "between" two other layers or elements may mean, here and in the following, that the one layer or the one element is arranged in direct mechanic and/or electric contact or in indirect contact to one of the two other layers or elements and in direct mechanic and/or electric contact or electric or indirect contact to other of the two other layers or elements. Here, in the case of indirect contact, further layers and/or elements may be arranged between the one and at least one of the two other layers, or between the one and the at least one of the two other elements, respectively.

By using the insulator layers according to the invention in organic optoelectronic components, a plasma and/or UV and/or ozone and/or temperature treatment of, e.g. substrates and electrodes can be used after application of the insulator layer and, at the same time, the narrowing of the light-emitting area of the light-emitting layer can be prevented, since the insulator layers according to the invention are chemically stable toward the influence of temperature, UV radiation, ozone and/or plasma due to their material properties. Just as well, application of thin film encapsulations is possible by means of methods such as CVD, PECVD, ALD or MLD without shortening the service life of the organic optoelectronic component. These methods may also be performed at high temperatures without impairing the insulator layers. This means that the insulator layers do neither degrade by UV and/or ozone and/or temperature and/or plasma influence nor lose nor lessen their properties with respect to an electric insulation. As a result, the service life of the organic optoelectronic component is prolonged by the use of the insulator layers without or hardly without a narrowing of the light-emitting area and without deterioration of other specifications such as robustness, storage durability and efficiency.

In one embodiment, an encapsulation, in particular a thin film encapsulation, is arranged above the light-emitting layer and the first and the second electrode.

In one embodiment, the organic optoelectronic component comprises a second insulator layer between the first and the second electrode. The second insulator layer is produced the same way as the first insulator layer. The first and the second insulator layer serve for electrically insulating the first and the second electrode from one another.

In one embodiment of the component, the first or the first and the second insulator layer comprise a direct contact to the light-emitting layer.

In one embodiment, the organic optoelectronic component comprises an electrode connection part of the first electrode and an electrode connection part of the second electrode. The electrode connection parts serve for electrically contacting the first electrode and the second electrode.

The first insulator layer may be arranged above the electrode connection part of the first electrode and above the first electrode. In particular, the first insulator layer comprises a direct contact to the electrode connection part of the first electrode, to the first electrode and to the second electrode.

The first insulator layer may have a direct contact to the encapsulation.

In one embodiment, the first and/or the second insulator layer is in direct contact with the first electrode and the second electrode.

The second insulator layer may be in direct contact to the substrate.

In one embodiment bus bars are arranged above the first electrode. The bus bars 11 are completely surrounded by the first electrode and further insulator layers. In particular, the bus bars are in direct contact to the first electrode and the further insulator layers. The further insulator layers are produced the same way as the first insulator layer. It is possible that the further insulator layers are directly applied to the bus bars. In particular, the bus bars and the further insulator layers have a direct contact to one another.

A reduction in the narrowing of the light-emitting area on bus bars is achieved by the further insulator layers above the bus bars.

In one embodiment, the organic optoelectronic component is an OLED.

Further advantages, advantageous embodiments and developments result from the exemplary embodiments described below in conjunction with the figures.

In the exemplary embodiments and figures, like, similar or equivalent elements may be indicated with the same reference numerals. The illustrated elements and their size ratios are not made to scale, rather individual elements such as layers, construction parts, components, and regions may be illustrated in an exaggerated size for the sake of clarity and/or for a better understanding.

Figure 1:
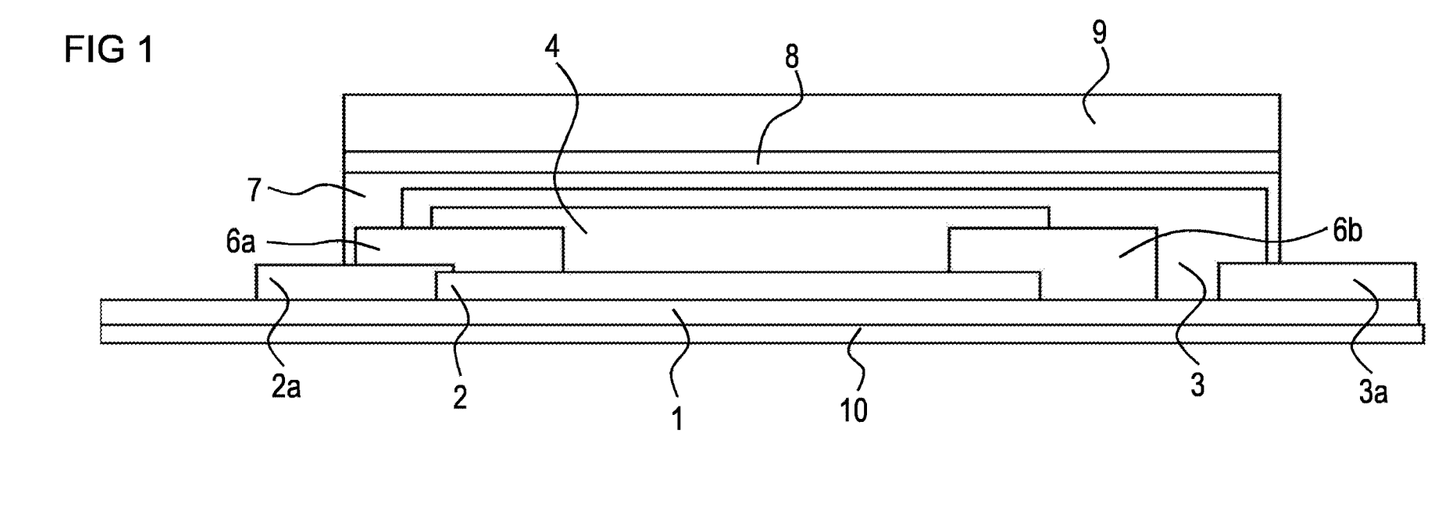
FIG. 1 a schematic illustration of an organic light-emitting diode according to an exemplary embodiment FIG. 2 a schematic illustration of an organic light-emitting diode according to an exemplary embodiment FIG. 3 a schematic illustration of a conventional organic light-emitting diode, FIG. 4 a narrowing of a light-emitting area on a conventional organic light-emitting diode, FIG. 5 the ratio of the normalized light density to the luminous period of a conventional organic light-emitting diode and an organic light-emitting diode according to the invention.

FIG. 1 shows an organic light-emitting diode (OLED). The OLED comprises a substrate 1, having a light-emitting layer 4 between the first electrode 2 and the second electrode 3 arranged thereon. For electrically contacting the first electrode 2 and the second electrode 3, the OLED comprises an electrode connection part of the first electrode 2a and an electrode connection part of the second electrode 3a. Underneath the encapsulation 7, the electrode connection parts 2a and 3a extend from the first 2 and the second electrode 3 outwards. The electrode connection parts 2a, 3a designed as electric contact supplies may have a transparent or non-transparent design depending on the radiation direction of the OLED and, for example, comprise or be of a transparent conductive oxide and/or a metal. Transparent conductive oxides (TCOs) are transparent conductive materials, usually metal oxides such as zinc oxide tin oxide, cadmium oxide, titanium oxide, indium oxide and indium tin oxide (ITO). A metal oxide, such as zinc oxide, tin oxide, cadmium oxide, titanium oxide, indium oxide and indium tin oxide (ITO) may be selected as TCO. Besides binary metal oxygen compounds such as $ZnO$, $SnO_2$ or $In_2O_3$, ternary metal oxygen compounds such as $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also count among the group of TCOs. Furthermore, the TCOs do not necessarily correspond to a stoichiometric composition and may also be p-doped or n-doped. For example, the electrode connection parts 2a, 3a may be formed by a metal layer or a metal layer stack, for example Mo/Al/Mo, Cr/Al/Cr or Al.

Furthermore, a first insulator layer 6a and a second insulator layer 6b are present, said layers electrically insulating the electrodes 2 and 3 from one another. The first insulator layer 6a is arranged above the electrode connection part of the first electrode 2a and above the first electrode 2 and has a direct contact to the electrode connection part of the first electrode 2a and to the first electrode 2. The first insulator layer only partially covers the first electrode 2 and the first electrode connection part. Above the first insulator layer 6a, the second electrode 3 is disposed in direct contact to the first insulator layer 6a. Further, the first insulator layer 6a is in direct contact to the light-emitting layer 4. The first insulator layer 6a is in direct contact to the encapsulation 7. The second insulator layer 6b is arranged between the first electrode 2 and the second electrode 3 and is in direct contact to the first electrode 2 and the second electrode 3. The second insulator layer 6b is further in direct contact to the light-emitting layer 4. Further, the second insulator layer 6b has a direct contact to the substrate 1. The insulator layers 6a, 6b are thus arranged on peripheral regions of the light-emitting layer 4 in such a way that they insulate the first and the second electrode 2, 3 electrically from one another in places in which they would otherwise be in contact to one another.

The first and the second insulator layer 6a, 6b are produced from a precursor that consists of a mixture of 75,76 weight percent of a first, 9,10 weight percent of a second and 15,15 weight percent of a third component.

The first component consists of:
50 to 60 weight percent of the compound of formula IA-1 formula IA-1

10 to 20 weight percent of the compound of formula IB-1 (2-methoxy-methylethoxypropanol)

IB-1

5 to 10 weight percent of the compound of formula IB-2 (methylproxitole)

IB-2

1 to 5 weight percent of the compound of formula IB-3 (ethylenglykolmono-n-butylether)

IB-3

5 to 10 weight percent of the compound of formula IB-4 (diacetone alcohol)

IB-4

The second component consists of or comprises:
60 to 100 weight percent of the compound of formula IIA-1 (ethylene glycol mono-n-butyletheracetate)

formula IIA-1

The third component consists of:
5 to 10 weight percent of the compound of formula III-1 (dietylentriamine)

III-1

1 to 5 weight percent of the compound of formula III-2 (2,4,6-tris-(dimethylaminomethyl)-phenol)

III-2

10 to 20 weight percent of the compound of formula IB-2 (methyl proxitol)

IB-2

10 to 20 weight percent of the compound of formula III-2 (methyl isobutyl ketone)

III-3

10 to 20 weight percent xylene.

At least one of the electrodes 2, 3 has a transparent design, so that light generated in the light-emitting layer 4 during operation of the OLED can be radiated outward through the at least one transparent electrode.

In the OLED shown in FIG. 1, substrate 1 has a transparent design, for example in the form of a glass plate or a glass layer. As an alternative, substrate 1 may also comprise a transparent plastic or a glass-plastic-laminate.

The electrode 2 applied to substrate 1 also has a transparent design and comprises a TCO, for example. The TCOs may be selected as described above. Further, a transparent electrode may also comprise a transparent metal, metallic network structures or conductive networks, for example having or made of silver, and/or graphene or carbon-containing layers or a combination of the above-mentioned transparent materials.

In the exemplary embodiment shown, the second electrode 3 on the light-emitting layer 4 has a reflective design and comprises a metal that can be selected from aluminum, barium, indium, silver, gold, magnesium, calcium and lithium as well as compounds, combinations and alloys thereof. In particular, the second electrode 3 may comprise Ag, Al or alloys or layer stacks with the aforementioned, for example Ag/Mg, Ag/Ca, Mg/Al or even Mo/Al/Mo or Cr/Al/Cr. Alternatively or additionally, the second electrode 3 may also comprise an above-mentioned TCO material or a layer stack with at least one TCO and at least one metal. Further, graphite or graphene are conceivable as well.

In the exemplary embodiment shown, the first electrode 2 is designed as an anode, while the second electrode 3 is designed as a cathode. However, a structure reversed in terms of polarity is possible if the materials are selected accordingly.

Electrodes 2, 3 have a large-area and continuous design so that the OLED is designed as a light source, in particular as a surface light source. Here, the term "large-area" may mean that the OLED has an area of equal to or greater than several square millimeters, preferably equal to or greater than one square centimeter and particularly preferably equal to or greater than one square decimeter.

In addition to the light-emitting layer 4, further organic layers may be arranged between the first electrode 2 and the second electrode 3, for example one or multiple selected from a hole injection layer, a hole transport layer, an electron blocking layer, a hole blocking layer, an electron transport layer, an electron injection layer and a charge generation layer (CGL), which are suitable for conducting holes or electrons to the light-emitting layer 4 or of blocking the respective transport. These layers may comprise organic polymers, organic oligomers, organic monomers, organic small non-polymer molecules ("small molecules") or combinations thereof. Materials for a hole injection layer, a hole transport layer, an electron blocking layer, a hole blocking layer, an electron transport layer, an electron injection layer and a charge generation layer are known to the person skilled in the art. Electroluminescent materials that have a radiation emission due to fluorescence or phosphorescence, such as polyfluorene, polythiophene or polyphenylene or derivatives, connections, mixtures or copolymers thereof are suitable as materials for the light-emitting layer.

An encapsulation 7 is arranged above the light-emitting layer 4 and the electrodes 2, 3 for protecting the light-emitting layer 4 and the first and second electrode 2, 3. Here, the encapsulation 7 is designed as a thin film encapsulation and is produced by means of CVD, PECVD, MLD and/or ALD.

Furthermore, viewed from substrate 1, a protection layer 9 bonded by means of an adhesive layer 8 may be arranged on the encapsulation 7, as shown in FIG. 1. Said protection layer 9, which can also be referred to as "superstate" in view of its arrangement when compared to substrate 1, may be formed by a glass layer or a glass plate or even a plastic, a metal or a combination or a laminate of the stated materials, for example, and in particular serve as a mechanic protection, in particular as a scratch protection in conjunction with an encapsulation 7 designed as a thin film encapsulation, without that the protection layer 9 itself needs to take effect in an encapsulating manner. Alternatively or additionally, a protective coating, for example in the form of a spray lacquer, may be applied to the encapsulation 7.

Due to the transparent substrate 1 and the transparent electrode 2, the OLED is designed as a so-called bottom emitter and radiates light through the transparent first electrode 2 and the transparent substrate 1 during operation. As illustrated in FIG. 1, for improving the decoupling of light, an optical decoupling layer 10 may be arranged on the side of the substrate 1 facing away from the light-emitting layer 4, with the decoupling layer 10 being designed as a scattering layer with scatter particles in a transparent matrix and/or with a light-scattering surface structure, for example. A decoupling layer may also be arranged between substrate 1 and the first electrode 2 arranged on substrate 1 or between other functional layers in the form of an internal decoupling layer.

As an alternative to the described bottom-emitter configuration, the second electrode 3 arranged to be facing away from substrate 1 may have a transparent design in order to radiate the light generated in the light-emitting layer 4 through the second electrode 3 in a direction facing away from the substrate 1. In this case, the OLED is designed as a so-called top emitter. The first electrode 2 arranged between the substrate 1 and the light-emitting layer 4 may also have a reflective design in the case that a light radiation through the substrate 1 is not desired. Just as well, in this case, substrate 1 may comprise a non-transparent material, for example a non-transparent glass, a non-transparent plastic, a metal or combinations thereof. In addition to the second electrode 3, the encapsulation 7 and, if present, even the adhesive layer 8 and the protection layer 9 have a transparent design in said top emitter configuration. Furthermore, in this case, a decoupling layer may be arranged above the second electrode 3, for example on the protection layer 9 or between the protection layer 9 and the encapsulation 7.

Further, the OLED may be designed as a bottom emitter and a top emitter at the same time and thus be preferably designed as a transparent OLED and have a combination of the features respectively specified in conjunction with the bottom emitter or top emitter configuration.

Figure 2:
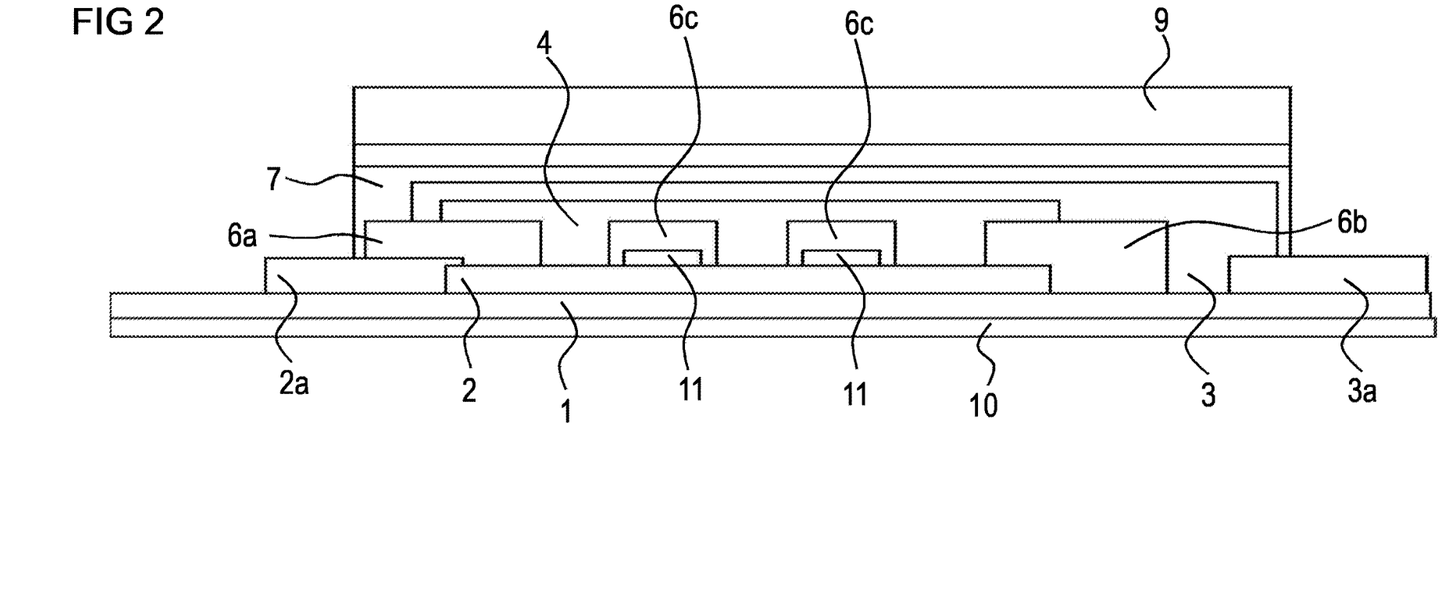

FIG. 2 shows an OLED, in which—compared to the OLED shown in FIG. 1—additionally bus bars 11 for current spreading are arranged in the first electrode 2 and are in direct contact to the first electrode 2. The main surface of the bus bars 11 facing away from the substrate 1 are covered with further insulator layers 6c and are in direct contact with the further insulator layers 6c. Thus, a bus bar 11 is completely surrounded by the first electrode 2 and the further insulator layer 6c. Insulator layers 6c are produced in analogy to insulator layers 6a, 6b. Depending on the radiation direction of the OLED, the bus bars may have a transparent or a non-transparent design and comprise or be made of a TCO and/or a metal, for example. For example, the bus bars 11 may be formed by a metal layer or a metal layer stack, for example Mo/Al/Mo, Cr/Al/Cr or Al. Plasma, ozone and/or UV radiation was used for surface cleaning.

Figure 3:
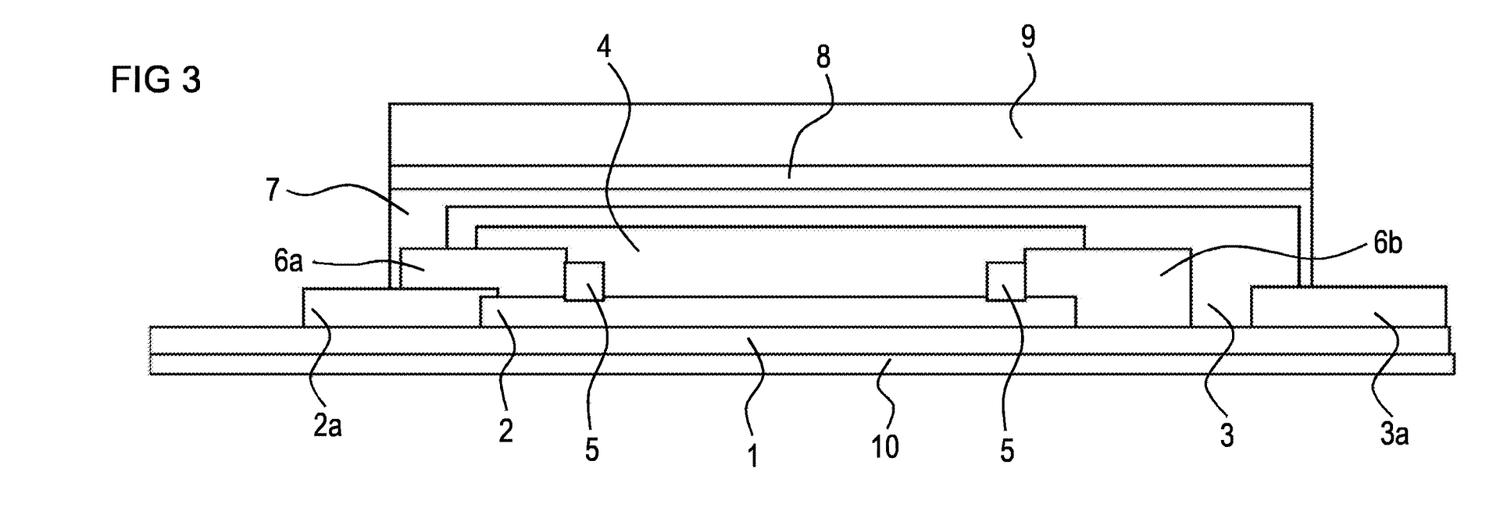

FIG. 3 shows an OLED, in which the insulator layers 6a, 6b are produced from a conventional material. Conventional insulator layers are partially destroyed by UV, plasma, ozone or temperature treatment and react with the material of the light-emitting layer 4, which leads to a narrowing 5 of the light-emitting area upon a certain operating time of the OLED. Said narrowing 5 of the light-emitting area does not or only hardly occur in the OLEDs equipped with the insulator layers according to the invention.

Figure 4:
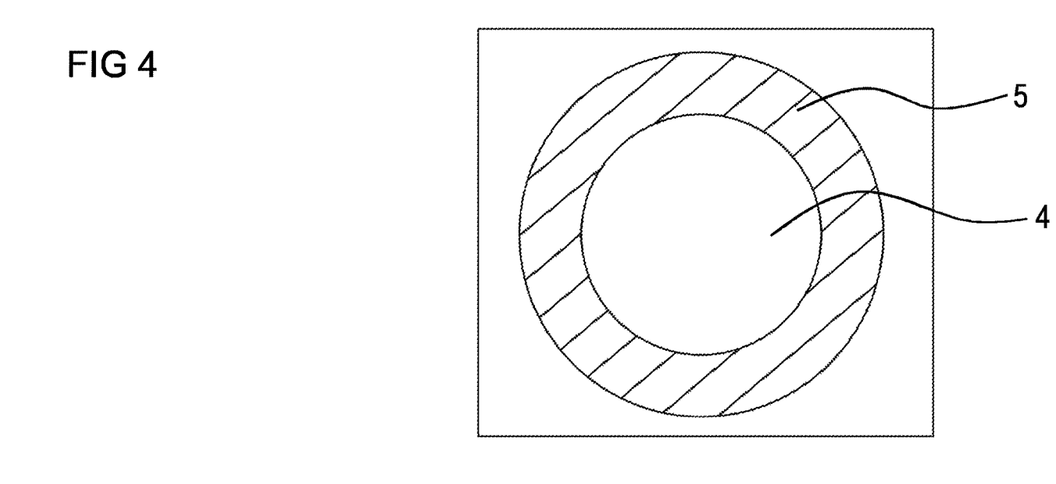

FIG. 4 shows the narrowing 5 of the light-emitting area of a conventional OLED in a plan view of the OLED during operation. It can be discerned that the light-emitting area of the light-emitting layer 4 is reduced by the narrowing 5 of the light-emitting area on the edges of said layer. The characteristics of the narrowing 5 of the light-emitting area can be determined by infrared radiation. Records taken by an IR camera show that a current flow takes place through the region of the narrowing 5 of the light-emitting area, but no emission of light.

Figure 5:
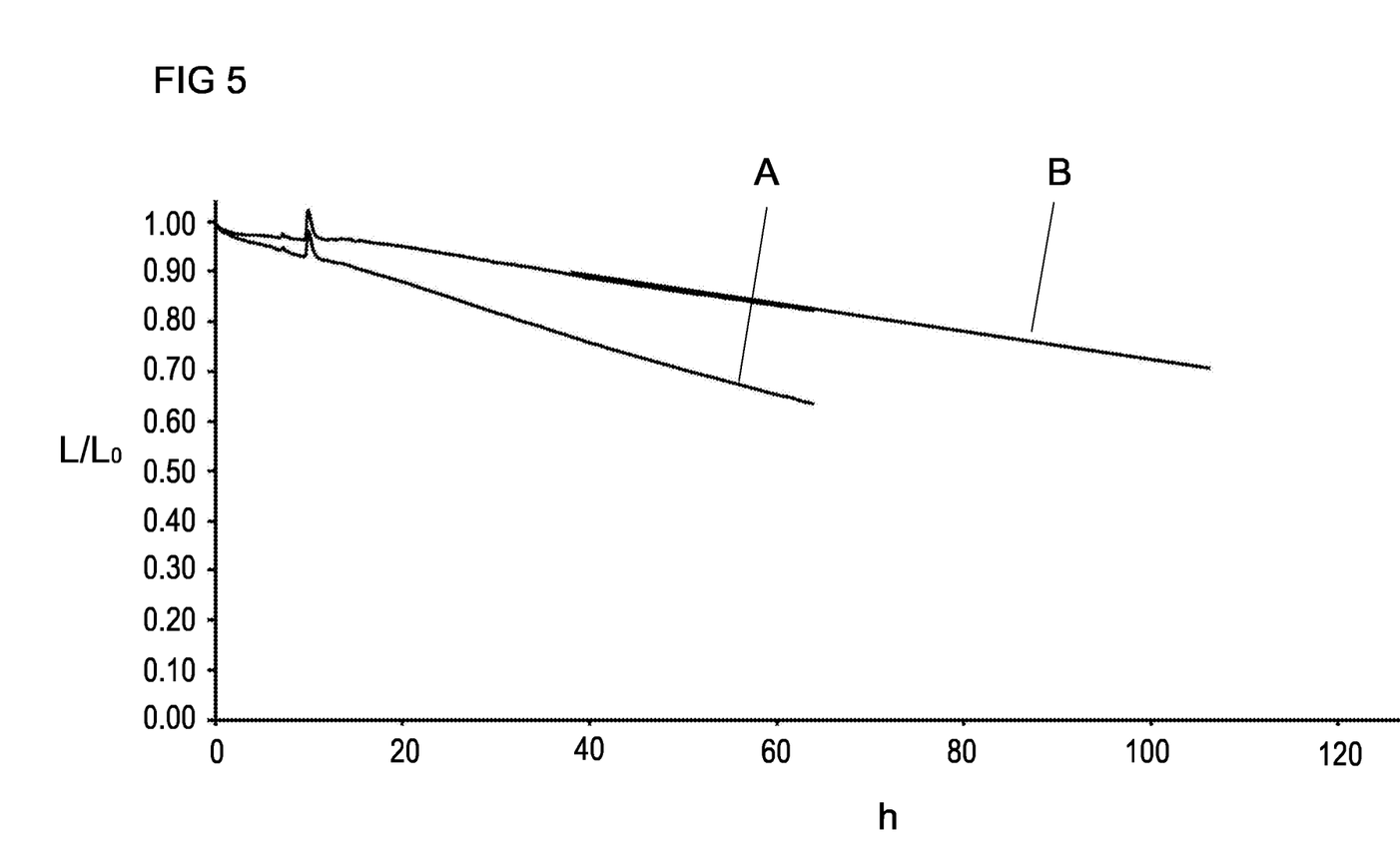

FIG. 5 shows the normalized light density of an OLED having conventional insulator layers and the normalized light density of an OLED having insulator layers according to the invention, as illustrated in FIG. 2. The normalized light density $L/L_0$ is plotted on the y-axis, while the luminous period in hours (h) is plotted on the x-axis. The normalized light density of an OLED with conventional insulator layers is assigned to the light density indicated with reference numeral A, and the normalized light density of an OLED with the insulator layers according to the invention is assigned to the normalized light density indicated with reference numeral B. Apart from the insulator layers, the OLEDs are identically constructed. As it turns out, the normalized light density decreases only slightly during the first approximately 15 hours of the luminous period of both OLEDs. After a luminous period of approximately 15 hours, the normalized light density of the conventional OLED drops almost linearly due to the narrowing of the light-emitting area. After a luminous period of approximately 50 hours, the normalized light density of the conventional OLED is at 70% only (normalized light density indicated with reference numeral A). The OLED according to the invention has a normalized light density of 80% even after an operating time of 105 hours (normalized light density indicated with reference numeral B). This can be traced back to a much less-pronounced narrowing of the light-emitting area, since the insulator layers are chemically stable toward the influence of temperature, UV, plasma and ozone during manufacture. As a result, the service life of an OLED is increased by means of the insulator layers according to the invention, while efficiency, density and storage durability are maintained.

The invention is not limited by the description in conjunction with the exemplary embodiments. The invention rather comprises any new feature as well as any combination of features, particularly including any combination of features in the patent claims, even if said feature or said combination per se is not explicitly indicated in the patent claims or exemplary embodiments.

LIST OF REFERENCE NUMERALS

1 substrate
2 first electrode
2a electrode connection part of the first electrode
3 second electrode
3a electrode connection part of the second electrode
4 light-emitting layer
5 narrowing of the light-emitting area
6a first insulator layer
6b second insulator layer
6c further insulator layer
7 encapsulation
8 adhesive layer
9 protection layer
10 decoupling layer
11 bus bar

The invention claimed is:
1. A method for producing an insulator layer, comprising the method steps:
   A) providing a precursor by mixing a first, a second and a third component, wherein
      the first component comprises a compound of the general formula IA and four compounds of the following formula IB-1, IB-2, IB-3 and IB-4

-continued

IB-3

IB-4 wherein
R$^1$ and R$^2$ are each independently selected from a group consisting of hydrogen and alkyl radicals and n=1 to 10,000;
the second component comprises a compound of the general formula IIA formula IIA wherein R$^3$ is an alkyl radical, and
the third component comprises at least one amine compound
B) applying the precursor to a substrate;
C) curing the precursor for the formation of the insulator layer.

2. The method according to claim 1, wherein the precursor consists of the first, the second and the third component and the first component is present at a concentration of 70 to 80 weight percent with respect to the total weight of the precursor.

3. The method according to claim 1, wherein the first component contains 45 to 65 weight percent of the compound of formula IA with respect to the total weight of the first component.

4. The method according to claim 1, wherein the compound of the general formula IIA of the second component has the following formula IIA-1:

IIA-1

5. The method according to claim 1, wherein the amine compound is selected from a group consisting of the compound of formula III-1, the compound of formula III-2 and combinations thereof:

III-1

III-2

6. A method for producing an insulator layer, comprising the method steps:
A) providing a precursor by mixing a first, a second and a third component, wherein
the precursor consists of the first, the second and the third component and the first component is present at a concentration of 70 to 80 weight percent, the second component is present at a concentration of 5 to 15 weight percent and the third component is present at a concentration of 10 to 20 weight percent with respect to the total weight of the precursor,
the first component comprises a compound of the general formula IA and four compounds of the following formulas IB-1, IB-2, IB-3 and IB-4

IA

IB-1

IB-2

IB-3

-continued

IB-4

IIA-1 wherein
R¹ and R² are each independently selected from a group consisting hydrogen and alkyl radicals and n=1 to 10,000;
the second component comprises a compound of the general formula IIA formula IIA wherein R³ is an alkyl radical, and
the third component comprises at least one amine compound
B) applying the precursor to a substrate;
C) curing the precursor for formation of the insulator layer.

7. The method according to claim 6, wherein the first component contains 45 to 65 weight percent of the compound of formula IA with respect to the total weight of the first component.

8. The method according to claim 6, wherein the compound of the general formula IIA of the second component has the following formula IIA-1:

9. The method according to claim 6, wherein the amine compound is selected from a group consisting of the compound of formula III-1, the compound of formula III-2 and combinations thereof:

III-1

III-2

* * * * *